United States Patent [19]

Tsuji

[11] Patent Number: 5,698,904
[45] Date of Patent: Dec. 16, 1997

[54] PACKAGING MATERIAL FOR ELECTRONIC COMPONENTS

[75] Inventor: Masahiro Tsuji, Kyoto, Japan

[73] Assignee: Rohm Co., Ltd., Kyoto, Japan

[21] Appl. No.: 782,447

[22] Filed: Jan. 13, 1997

Related U.S. Application Data

[63] Continuation of Ser. No. 295,535, Aug. 25, 1994, abandoned.

[30] Foreign Application Priority Data

Sep. 3, 1993 [JP] Japan .................................. 5-219952

[51] Int. Cl.$^6$ .................................................. H01L 23/29
[52] U.S. Cl. ........................ 257/795; 257/789; 257/792; 257/793; 257/794
[58] Field of Search ........................ 257/795, 789, 257/792, 793, 787, 788, 786

[56] References Cited

U.S. PATENT DOCUMENTS

| | | | |
|---|---|---|---|
| 4,931,852 | 6/1990 | Brown et al. ................. | 257/786 |
| 5,113,241 | 5/1992 | Yanagida et al. ............. | 257/795 |
| 5,202,753 | 4/1993 | Shintai ........................... | 257/795 |
| 5,334,674 | 8/1994 | Naka et al. .................... | 525/481 |

FOREIGN PATENT DOCUMENTS

| | | | |
|---|---|---|---|
| 61-32446 | 2/1986 | Japan ................. | 257/787 |
| 6129159 | 2/1986 | Japan ................. | 257/795 |
| 6132446 | 2/1986 | Japan ................. | 257/795 |
| 1-11355 | 1/1989 | Japan ................. | 257/789 |
| 64-011355 | 1/1989 | Japan ................. | 257/789 |
| 2306702 | 2/1989 | Japan . | |
| 1073650 | 3/1989 | Japan ................. | 257/789 |

*Primary Examiner*—Mahshid D. Saadat
*Assistant Examiner*—Jhihan B. Clark
*Attorney, Agent, or Firm*—Nikaido Marmelstein Murray & Oram LLP

[57] ABSTRACT

A packaging material for electronic components is provided which inhibits the cracking of a passivation film on an encapsulated chip and inhibits the breaking of an interconnecting metallization pattern in a chip of an electronic component and meets the miniaturization trend for electronic components. The packaging material includes: a resin, and 80% to 93% by weight, relative to the total amount of the packaging material, of a filler made up of particles having an average particle size of 30 μm or less, at least 90% by weight of which are spherically shaped or have rounded ends and/or edges.

9 Claims, 3 Drawing Sheets

PACKAGING MATERIAL FOR ELECTRONIC COMPONENTS

This application is a continuation of application Ser. No. 08/295,535, filed Aug. 25, 1994 abandoned.

BACKGROUND OF THE INVENTION

The present invention relates to a material for encapsulating a chip of an electronic component and, more particularly, to such a packaging material which will not damage the electronic circuit of the chip and will inhibit the occurrence of cracks in the resin package.

An electronic component having an electronic circuit, such as a semiconductor chip having a semiconductor integrated circuit, is typically protected by a resin package. Conventionally, such a resin package has been as thick as 2 mm or more. For that reason, in mounting an electronic component on a substrate, it is not necessary to take so much into consideration the thermal stress which occurs upon reflow or dip soldering. The package itself has a sufficient resistance to the thermal stress. The packaging material is usually formed of epoxy resin which is inexpensive and is excellent in burning resistance, electrical insulating properties, adhesive strength, mechanical strength, weatherability and the like. The packaging material contains 70% to 75% by weight of a filler comprising pulverized particles each angularly shaped, for example like a plate or a needle, and having an average particle size of about 60 to about 80 μm.

As recent electronic devices have been down-sized and have exhibited higher performance, higher integration and miniaturization have been required for electronic components, such as semiconductor integrated circuits, for use in those electronic devices. For that reason, the thickness of a package for each electronic component has been reduced to 1.4 mm or smaller. When the conventional packaging material is used to form such a thin package, a crack is likely to occur due to thermal stress produced during the mounting of the electronic components. Attempts have been made to prevent the occurrence of such cracks by lowering the water absorption of the packaging material or increasing the proportion of the filler contained in the packaging material up to 80% by weight or more for higher strength. Since an increased proportion of the filler results in the packaging material of higher viscosity, it has been a recent trend to reduce the proportion of an angular, pulverized-particle filler and increase that of a spherical-particle filler.

On the other hand, since the metallization pattern of a chip has been increasingly miniaturized for a higher integration of semiconductor integrated circuit, a semiconductor integrated circuit chip is typically manufactured under a metallization design rule of 0.5 to 08. μm. If a chip having such a miniaturized pattern is packaged with a packaging material containing a large proportion of a filler, the filler is likely to be present adjacent the surface of the chip. The presence of many filler particles or filler particles of large size would cause large stress to local work in a portion of the packaging where such particles are present because of the shrinkage of the packaging material upon curing or of upon being subjected to the heat involved in a later mounting process. As a result, the angular filler particles present adjacent the chip surface are pressed against a chip, so that the passivation film for protecting the surface of the chip is likely to be damaged and, hence, the metallization pattern formed on the chip may be broken.

Particularly where the filler contains angular pulverized particles or large particles, the metallization pattern is likely to be broken thereby under these conditions.

To solve the foregoing problems, it is an object of the present invention to provide a highly reliable packaging material which ensures less likelihood of developing cracks in the passivation film and of breaking the metallization pattern, thereby facilitating miniaturization of electronic components.

SUMMARY OF THE INVENTION

According to an aspect of the present invention, there is provided a packaging material for electronic components comprising a resin and 80% to 93% by weight, relative to the total amount of the packaging material, of a filler. The filler comprises particles of an average particle size of 30 μm or less, at least 90% by weight of which have a spherical shape or have rounded ends and edges.

It is preferable that the filler is silica.

It is preferable that the resin is an epoxy resin.

According to another aspect of the present invention, there is provided a semiconductor device comprising a semiconductor chip, which is bonded on a die pad, having a plurality of leads each serving an electrode on an outer periphery of said die pad, wherein said semiconductor chip is electrically connected to each of said leads by means of metallic wire, wherein said semiconductor chip and said leads are encapsulated with a packaging material, wherein said packaging material contains 80% to 93% by weight of a filler which contains at least 90% by weight having particle of an average particle size of 30 μm or less, and which are spherical in shape or have rounded ends and edges.

It is preferable that a thickness of a package encapsulated with said packaging material is at most 1.4 mm.

Accordingly to the present invention, the packaging material for electronic components contains 80% to 93% by weight of the filler relative to the total amount of the packaging material, and the filler comprises particles having an average particle size as small as 30 μm or less, and wherein the particles are spherical in shape or have rounded ends and/or edges. The packaging material of such constitution has enhanced uniformity and ensures less local internal stress.

Consequently, the filler contained in the resin hardly causes a crack in the passivation film formed on the encapsulated chip or a break in the metallization pattern of the chip. In addition, the use of the filler in such relatively large amounts even ensures less likelihood of the occurrence of cracking in a thin package, thereby contributing to stable electronic components.

DETAILED DESCRIPTION

Intensive study has been repeatedly made to develop a packaging material which will hardly cause the passivation film on a package semiconductor to crack and the metallization pattern on the semiconductor device to be broken even when applied to a small-sized, highly-integrated semiconductor chip. As a result, it has been found that a packaging material overcoming the foregoing problems involved in the prior art can be obtained by mixing a relatively large amount (80% to 93% by weight) of a filler with a conventional resin, provided that the filler comprises particles of having an average particle size of 30 μm or less, and provided further that each particle is shaped spherical or has rounded ends and/or edges. The present invention has been attained on the basis of such finding.

Figure 1A:
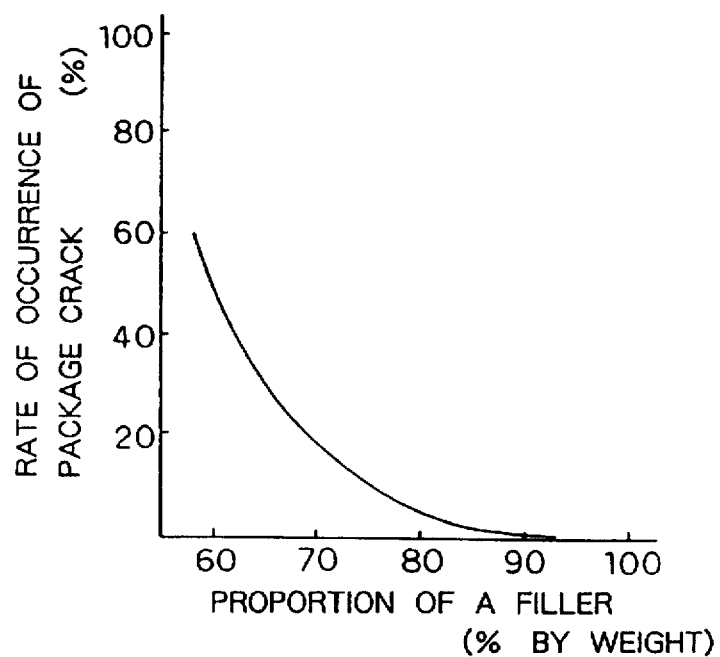
FIG. 1(a) is a graphic representation showing the relationship between the proportion of a filler used in a packaging material and the rate of occurrence of cracks in the package.
Figure 1B:
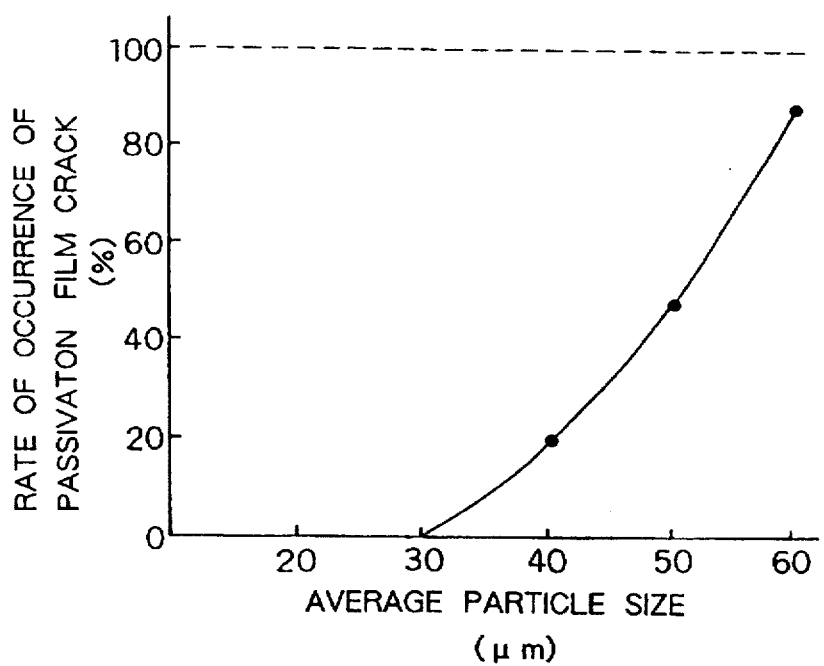
FIG. 1(b) also a graphic representation showing the relationship between the average particle size of the filler and the rate of occurrence of passivation film cracking.

As described earlier, the conventional packaging material typically contains up to about 70% by weight of a filler relative to the total amount of the packaging material, the filler mainly comprising pulverized particles of an average particle size of about 60 to about 80 μm. It has, however, been found that increasing the proportion of a filler, comprising small spherical or rounded particles, will cause a passivation film to hardly crack or a metallization pattern to be hardly broken. The rate of occurrence of crack was examined as a function of varying the proportion of filler contained in an epoxy resin. The filler comprised silica particles of an average particle size of about 20 μm. For each proportion of the filler, 200 devices are manufactured. The results were as shown in FIG. 1(a). As apparent from FIG. 1(a), when the proportion of the filler increases, up to 80% by weight or more, the rate of occurrence of package cracking decreases sharply. This is because increasing proportion of the filler up to 80% by weight or more causes the resulting package to effect significantly improved mechanical strength and strength against heat. Nevertheless, when the proportion of the filler increases too much, the viscosity of the packaging material increases undesirably and, hence, it becomes difficult and takes a long time to fill the packaging material into a mold and, in addition, the resulting package is more likely to have voids. Accordingly, the proportion of the filler is preferably at most about 93% by weight.

A filler comprising non-angular or spherical particles is conventionally used, but if such a filler is of a relatively large particle size and is used in a packaging material for a miniaturized semiconductor chip, then the material is likely to cause the passivation film on the chip to crack or a break to occur in the metallization pattern of the chip. As a result of intensive and repeated study by the present inventor, there has been found that merely rounding off angles of edges of the filler particles is insufficient to inhibit the occurrence of cracking. Further, reducing the average particle size of the filler particles to 30 μm or less in addition to the rounding off of the filler particles substantially completely inhibits the occurrence of crack. Preferably, all the filler particles are spherically shaped or have rounded ends. Nevertheless, the filler can contain at most about 10% by weight of angular, that is unrounded, particles, and the crack-inhibiting effect appears when the filler contains at least 90% by weight of particles of an average particle size of 30 μm or less, each having a spherical shape or having rounded ends.

The resin for use in the packaging material of the present invention is preferably a thermosetting resin such as an epoxy resin.

The material of the filler to be filled into the resin should be excellent in hydrophobic nature, strength and adhesion with the resin. Examples of preferred materials for the filler include silica and alumina. Among these, less costly silica is especially favorable.

Figure 2:
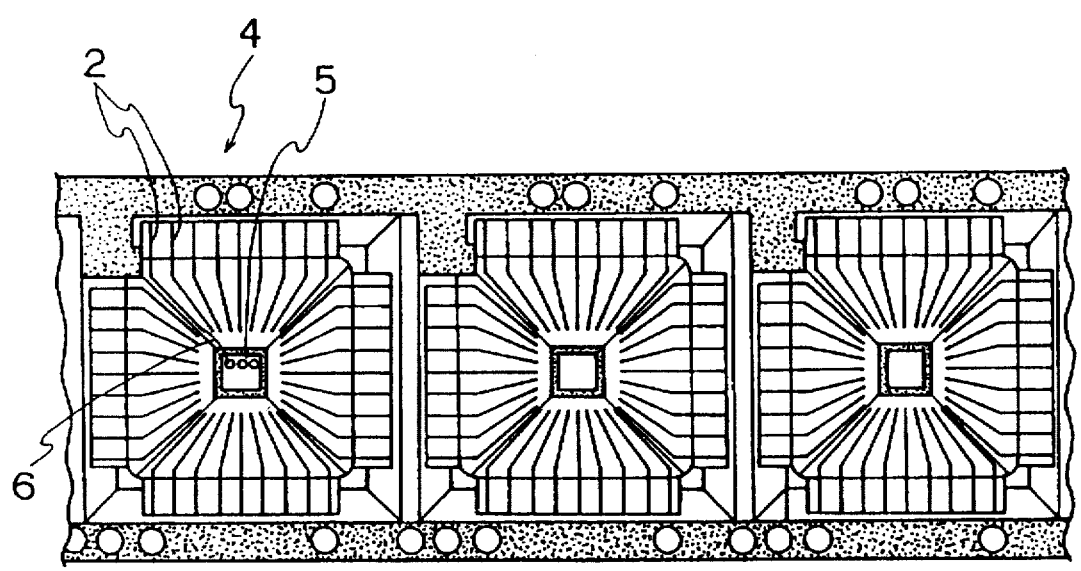
FIG. 2 is a plan view illustrating a production process for a semiconductor device in which the packaging material of the present invention is used.
Figure 3:
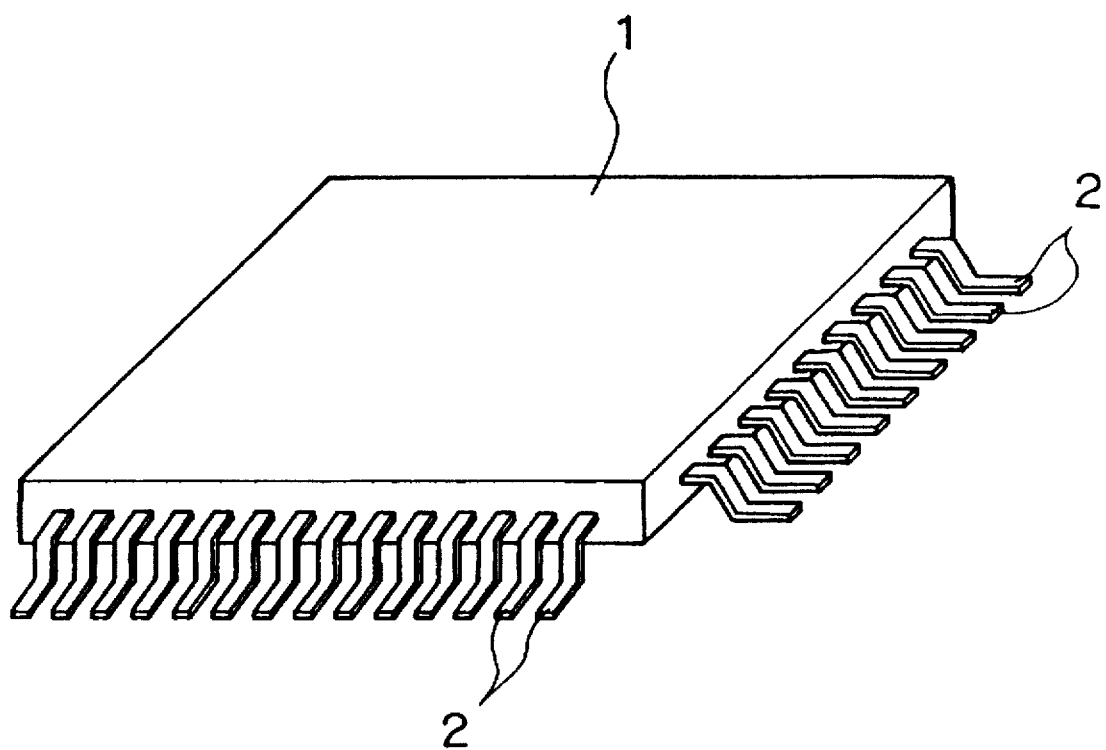
FIG. 3 is a perspective view showing a semiconductor device in a quad flat package in which the packaging material of the present invention is used.

Reference is then made to a method for fabricating a semiconductor device using the packaging material of the present invention. As shown in FIG. 2, a semiconductor chip is die-bonded to the die pad 7 of a lead frame 4 formed by punching or etching. Subsequently the semiconductor chip 5 and each lead 2 are electrically connected to each other through a gold wire 6 by wire bonding. The semiconductor chip 5 is then encapsulated with the packaging material of the invention for protection. The portions, such as a tie bar, of the lead frame 2 which join leads 5 together are cut off to electrically isolate the leads 5 from one another. Thus, a semiconductor device having an encapsulating package 1, the thickness of which is at most 1.4 mm, as shown in FIG. 3 is completed.

Although in the abovementioned fabrication method the packaging material of the present invention is applied to a quad flat package (QFP), it is needless to say that the packaging material is also applicable to other packages, such as the small outline package (SOP). Further, applications of the packaging material are not limited to encapsulation of semiconductor devices, and the packaging material of the invention is also applicable to encapsulation of other electronic components such as a resistor chip and a capacitor chip without affecting the miniaturized patterns thereof.

A specific example of the present invention follows.

A packaging material was prepared by filling 90% by weight of a filler of silica particles into an epoxy resin. The filler had an average particle size of 20 μm and containing spherical particles in an mount of 90% by weight or more relative to the total amount of the filler. Using this packaging material, 200 semiconductor devices were fabricated. These semiconductor devices were subjected to a severe life test where a high temperature (150° C.) condition for 30 minutes and a low temperature (−55° C.) condition for 30 minutes were alternately repeated 1000 times. The test revealed that the rate of occurrence of crack in each of the passivation film and the package was substantially decreased to 1% or lower.

Further, the packaging material of the invention was found to cause the passivation film to hardly crack without a coating material such as of polyimide which had been provided on the passivation film before the packaging with the conventional packaging material.

As has been described, the packaging material for electronic components according to the present invention comprises a resin and a filler filled in the resin, the filler comprising particles of an average particle size as small as 30 μm or less, each shaped spherical or having rounded ends. The packaging material of this constitution causes localized internal stress associated with the curing of the resin to be reduced. As a result, a highly reliable electronic component is obtained in which a crack in the passivation film and/or a break in the metallization pattern are less likely.

Further, the packaging material of the present invention allows the yield and reliability of electronic devices to be improved while contributing to a cost reduction. In addition, it will contribute to the down-sizing of electronic components and hence of electronic devices.

While only certain presently preferred embodiments of the invention have been described in detail, as will be apparent to those familiar with the art, certain changes and modifications can be made without departing from the spirit and scope of the invention as defined by the following claims.

What is claimed is:

1. A packaging material for electronic components comprising: a resin, and 90% to 93% by weight, relative to the total amount of the packaging material, of a filler comprising at least one member selected from the group consisting of silica and alumina, wherein said filler comprises at least 90% by weight of small particles of an average particle size of 20 to 30 µm, and wherein at least said small particles have rounded ends.

2. The packaging material of claim 1, wherein the filler consists essentially of at least one member selected from the group consisting of alumina and silica.

3. The packaging material of claim 1, wherein said resin is an epoxy resin.

4. A semiconductor device as claimed in claim 1 wherein said small particles with rounded ends comprise spherical particles.

5. A semiconductor device comprising a semiconductor chip having a plurality of metallic wire leads each serving as electrode, wherein said semiconductor chip and said leads are encapsulated within a packaging material comprising 90% to 93% by weight of a filler, which filler comprises at least 90% by weight of small particles of an average particle size of 20 to 30 µm, which have rounded ends, and the remainder is resin.

6. The semiconductor device of claim 5, wherein a thickness of a package encapsulated within said packaging material is at most 1.4 mm.

7. A semiconductor device as claimed in claim 5 wherein said semiconductor chip is bonded to a die pad.

8. A semiconductor device as claimed in claim 5 wherein said small particles with rounded ends comprise spherical particles.

9. The semiconductor device as claimed in claim 5 wherein said filler consists essentially of at least one member selected from the group consisting of silica and alumina.

* * * * *